(12) United States Patent
Yamazaki

(10) Patent No.: US 10,756,670 B2
(45) Date of Patent: Aug. 25, 2020

(54) RESONATOR, OSCILLATOR, ELECTRONIC APPARATUS, AND VEHICLE

(71) Applicant: SEIKO EPSON CORPORATION, Tokyo (JP)

(72) Inventor: Takashi Yamazaki, Shiojiri (JP)

(73) Assignee: SEIKO EPSON CORPORATION, Tokyo (JP)

( * ) Notice: Subject to any disclaimer, the term of this patent is extended or adjusted under 35 U.S.C. 154(b) by 507 days.

(21) Appl. No.: 15/829,616

(22) Filed: Dec. 1, 2017

(65) Prior Publication Data

US 2018/0175794 A1 Jun. 21, 2018

(30) Foreign Application Priority Data

Dec. 19, 2016 (JP) ................. 2016-245134

(51) Int. Cl.
| | |
|---|---|
| *H03H 9/02* | (2006.01) |
| *H03B 5/04* | (2006.01) |
| *H03B 5/32* | (2006.01) |
| *H01L 41/16* | (2006.01) |
| *H01L 41/09* | (2006.01) |
| *H01L 41/083* | (2006.01) |
| *H03H 9/24* | (2006.01) |
| *H03H 9/05* | (2006.01) |
| *H03H 3/007* | (2006.01) |

(52) U.S. Cl.
CPC ............. *H03B 5/04* (2013.01); *H01L 41/083* (2013.01); *H01L 41/09* (2013.01); *H01L 41/16* (2013.01); *H03B 5/32* (2013.01); *H03H 3/0072* (2013.01); *H03H 9/02448* (2013.01); *H03H 9/0552* (2013.01); *H03H 9/2489* (2013.01)

(58) Field of Classification Search
CPC ........ H03H 5/32; H03H 5/04; H03H 9/02448; H03H 9/0552; H03H 9/2489; H01L 41/16; H01L 41/09; H01L 41/083
See application file for complete search history.

(56) References Cited

U.S. PATENT DOCUMENTS

| | | | | |
|---|---|---|---|---|
| 6,271,619 | B1 * | 8/2001 | Yamada ................... | H03H 3/02 310/324 |
| 9,461,615 | B2 | 10/2016 | Yamazaki et al. | |
| 9,748,921 | B2 * | 8/2017 | Yamazaki ................ | H03H 9/21 |
| 2003/0006862 | A1 * | 1/2003 | Takeuchi ............... | H03H 9/174 333/187 |

(Continued)

FOREIGN PATENT DOCUMENTS

| | | |
|---|---|---|
| JP | 2005-311849 A | 11/2005 |
| JP | 2006-352619 A | 12/2006 |

(Continued)

*Primary Examiner* — J. San Martin
(74) *Attorney, Agent, or Firm* — Oliff PLC

(57) ABSTRACT

A resonator includes a surface silicon layer as a base material, a first silicon oxide layer disposed on a first surface of the surface silicon layer, and a second silicon oxide layer disposed on the opposite side to the surface silicon layer of the first silicon oxide layer, wherein when the thickness of the surface silicon layer is represented by tsi, the thickness of the first silicon oxide layer is represented by ta, and the thickness of the second silicon oxide layer is represented by tb, the following relationships are satisfied: $0.138 \times tsi < ta < 0.268 \times tsi$ and $0.189 \times tsi < tb < 0.527 \times tsi$.

20 Claims, 14 Drawing Sheets

(56) References Cited

U.S. PATENT DOCUMENTS

| | | | |
|---|---|---|---|
| 2003/0132683 A1* | 7/2003 | Yamada | ............... C23C 14/10 310/346 |
| 2015/0022274 A1* | 1/2015 | Yamazaki | ............. H03H 9/171 331/156 |
| 2016/0065173 A1 | 3/2016 | Nishimura et al. | |

FOREIGN PATENT DOCUMENTS

| | | |
|---|---|---|
| JP | 5168002 B2 | 1/2013 |
| JP | 2015-23434 A | 2/2015 |
| JP | 2015-41785 A | 3/2015 |
| WO | 2014-185281 A1 | 11/2014 |

* cited by examiner

RESONATOR, OSCILLATOR, ELECTRONIC APPARATUS, AND VEHICLE

CROSS REFERENCE

This application claims benefit of Japanese Application JP 2016-245134, filed on Dec. 19, 2016. The disclosure of the prior application is hereby incorporated by reference herein in its entirety.

BACKGROUND

1. Technical Field

The present invention relates to a resonator, and an oscillator, an electronic apparatus, and a vehicle, each including the resonator.

2. Related Art

There has been known a resonator having an MEMS (Micro Electro Mechanical Systems) structure in which an excitation section including a piezoelectric thin film is formed on an Si semiconductor layer. For example, JP-A-2014-185281 (Patent Document 1) cited below discloses a resonator device (resonator) in which each one end of a plurality of vibration arms is connected to a base section. This resonator device has a structure in which a silicon oxide layer is stacked on an Si layer to become the vibration arm, and an excitation section is provided on the silicon oxide layer. Then, by setting the ratio of the sum of the thickness of the Si layer and the thickness of the silicon oxide layer to the thickness of the Si layer to a predetermined condition, the temperature coefficient of frequency (TCF) is decreased, whereby a resonator having a favorable frequency temperature characteristic can be formed.

Patent Document 1 describes that a plurality of silicon oxide layers may be stacked. However, a specific configuration of the silicon oxide layers capable of decreasing the absolute value of the temperature coefficient of frequency (TCF) in the case where the resonator device (resonator) described in Patent Document 1 includes a plurality of silicon oxide layers is not disclosed. Therefore, a resonator having a favorable frequency temperature characteristic is not necessarily obtained.

SUMMARY

An advantage of some aspects of the invention is to solve at least a part of the problems described above and the invention can be implemented as the following application examples or forms.

Application Example 1

A resonator according to this application example includes a base material, a first silicon oxide layer disposed on a first surface of the base material, and a second silicon oxide layer disposed on the opposite side to the base material of the first silicon oxide layer, wherein when the thickness of the base material is represented by tsi, the thickness of the first silicon oxide layer is represented by ta, and the thickness of the second silicon oxide layer is represented by tb, the following relationships are satisfied: $0.138 \times tsi < ta < 0.268 \times tsi$ and $0.189 \times tsi < tb < 0.527 \times tsi$.

As a result of studies, the present inventors found that when the film thickness of the first silicon oxide layer and the film thickness of the second silicon oxide layer formed on the base material satisfy the above-mentioned conditions, the frequency temperature characteristic in the case where two silicon oxide layers are included is favorable. Therefore, according to this application example, the resonator having an excellent frequency temperature characteristic can be obtained.

Application Example 2

In the resonator according to the application example, it is preferred that the following relationships are satisfied: $0.157 \times tsi < ta < 0.229 \times tsi$ and $0.226 \times tsi < tb < 0.451 \times tsi$.

According to this application example, the temperature coefficient of frequency (TCF) can be further decreased, and the resonator having a more excellent frequency temperature characteristic can be obtained.

Application Example 3

In the resonator according to the application example, it is preferred that the following relationships are satisfied: $0.176 \times tsi < ta < 0.191 \times tsi$ and $0.264 \times tsi < tb < 0.375 \times tsi$.

According to this application example, the temperature coefficient of frequency (TCF) can be still further decreased, and the resonator having a still more excellent frequency temperature characteristic can be obtained.

Application Example 4

In the resonator according to the application example, it is preferred that the second silicon oxide layer has a lower density than the first silicon oxide layer.

A silicon oxide layer having a relatively high density and a silicon oxide layer having a relatively low density are different in, for example, the ease of control of the film thickness or an ability to correct the frequency temperature characteristic. According to this application example, the first silicon oxide layer having a relatively high density and the second silicon oxide layer having a relatively low density can mutually complement the characteristics. Therefore, as compared with the case where one silicon oxide layer is included, the variation in the quality can be suppressed in the silicon oxide layers as a whole, and thus, the variation in the frequency temperature characteristic can be reduced.

Application Example 5

In the resonator according to the application example, it is preferred that the etching rate of the second silicon oxide layer is larger than the etching rate of the first silicon oxide layer.

According to this application example, since the etching rate of the second silicon oxide layer is larger than the etching rate of the first silicon oxide layer, even if the film thickness of the second silicon oxide layer is made thicker than the film thickness of the first silicon oxide layer, an etching time of the second silicon oxide layer is not prolonged, and the tact time in etching can be reduced, and thus, the productivity can be improved.

Application Example 6

In the resonator according to the application example, it is preferred that the first surface is a surface intersecting the vibration direction of the base material.

According to this application example, by forming the first silicon oxide layer and the second silicon oxide layer in a stacked manner on the surface intersecting the vibration direction of the base material, the temperature coefficient of frequency (TCF) of the resonator can be more effectively changed, and thus, the resonator having an excellent frequency temperature characteristic can be easily obtained.

Application Example 7

In the resonator according to the application example, it is preferred that the resonator further includes a first electrode disposed on the opposite side to the first silicon oxide layer of the second silicon oxide layer, a piezoelectric layer disposed on the opposite side to the second silicon oxide layer of the first electrode, and a second electrode disposed on the opposite side to the first electrode of the piezoelectric layer.

According to this application example, by stacking the first electrode, the piezoelectric layer, and the second electrode in this order on the second silicon oxide layer, the resonator can be stably vibrated in a direction intersecting the first surface of the base material.

Application Example 8

An oscillator according to this application example includes the resonator according to the application example described above and an oscillation circuit which oscillates the resonator.

According to this application example, by including the resonator having an excellent frequency temperature characteristic, the oscillator having higher performance can be provided.

Application Example 9

An electronic apparatus according to this application example includes the resonator according to the application example described above.

According to this application example, by utilizing the resonator having an excellent frequency temperature characteristic in an electronic apparatus, the electronic apparatus having higher performance can be provided.

Application Example 10

A vehicle according to this application example includes the resonator according to the application example described above.

According to this application example, by utilizing the resonator having an excellent frequency temperature characteristic in a vehicle, the vehicle having higher performance can be provided.

BRIEF DESCRIPTION OF THE DRAWINGS

The invention will be described with reference to the accompanying drawings, wherein like numbers reference like elements.

DESCRIPTION OF EXEMPLARY EMBODIMENTS

Hereinafter, embodiments embodying the invention will be described with reference to the drawings. The following is an embodiment of the invention and does not intend to limit the invention. In order to facilitate the explanation, there may be a case where each of the drawings is illustrated on a reduced scale different from the actual scale.

Embodiments

Resonator

First, a resonator 1 according to this embodiment will be described with reference to FIGS. 1A, 1B, and 1C.

Figure 1A:
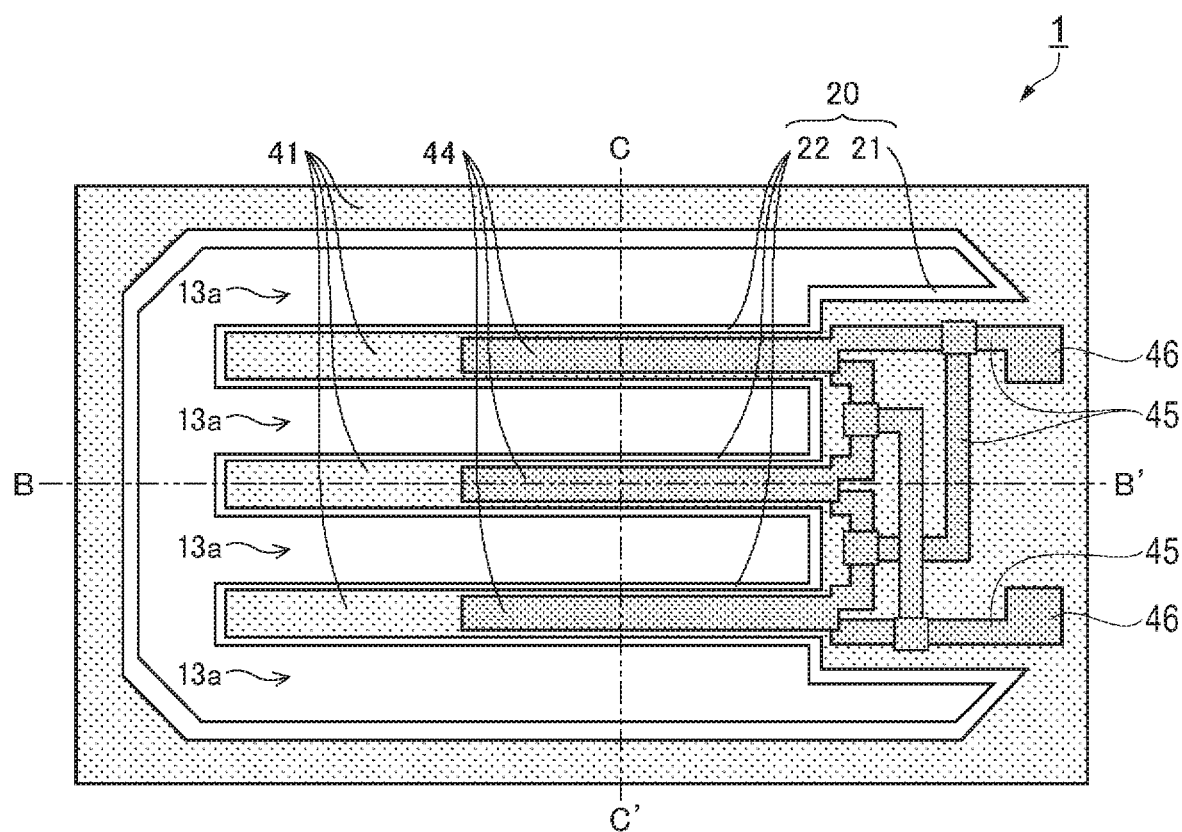
FIG. 1A is a schematic plan view showing a configuration of a resonator according to an embodiment.

FIG. 1A is a schematic plan view showing a configuration of the resonator according to this embodiment. FIG. 1B is a schematic cross-sectional view taken along the line B-B' of FIG. 1A, and FIG. 1C is a schematic cross-sectional view taken along the line C-C' of FIG. 1A. The lines indicating the background of the cross section are omitted.

The resonator 1 according to this embodiment can be produced by processing an SOI (Silicon on Insulator) substrate 10. The SOI substrate 10 is a substrate obtained by stacking a base layer (silicon substrate 11), a buried oxide (BOX) film 12, and a surface silicon layer 13 in this order. For example, the silicon substrate 11 and the surface silicon layer 13 are constituted by single-crystal silicon, and the buried oxide film 12 is constituted by a silicon oxide layer ($SiO_2$ or the like). In this embodiment, the surface silicon layer 13 corresponds to the base material.

Figure 1B:
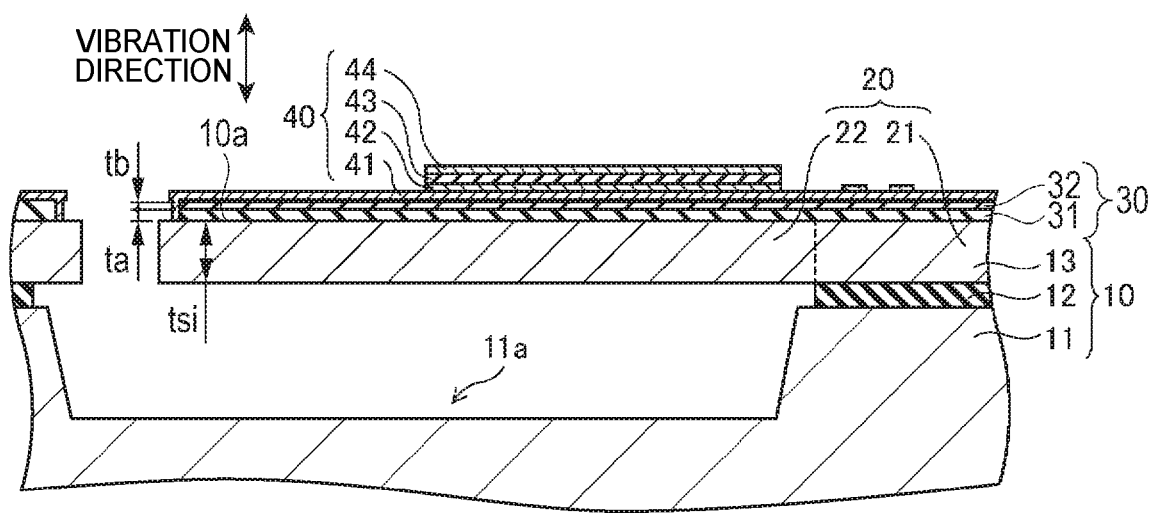
FIG. 1B is a schematic cross-sectional view taken along the line B-B' of FIG. 1A.
Figure 1C:
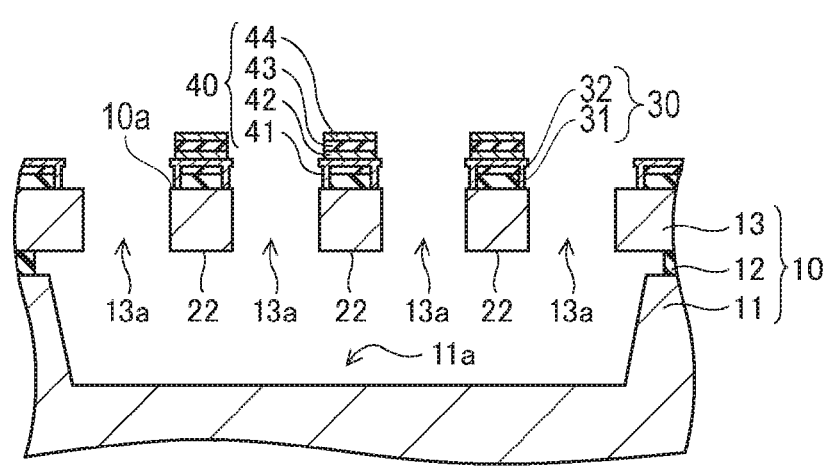
FIG. 1C is a schematic cross-sectional view taken along the line C-C' of FIG. 1A.

As shown in FIGS. 1A to 1C, the resonator 1 includes the silicon substrate 11, the buried oxide film 12 which is disposed in a region of a part of the silicon substrate 11, a resonator body 20 which is constituted by silicon of the surface silicon layer 13, a temperature characteristic adjustment film 30 which is a silicon oxide layer disposed in a predetermined region of the resonator body 20, and a piezoelectric drive section 40 which is disposed on the opposite side to the resonator body 20 of the temperature characteristic adjustment film 30 and covers at least a part of the temperature characteristic adjustment film 30.

The resonator body 20 includes a fixing section 21 which is supported by the buried oxide film 12 and a vibration arm 22 which is separated from the surrounding silicon other than the fixing section 21 by a trench 13a on a region where the buried oxide film 12 is removed. In the example shown in FIGS. 1A to 1C, the resonator body 20 includes three vibration arms 22. On the silicon substrate 11 at a position facing the vibration arms 22, a cavity 11a is formed. In this embodiment, the resonator including three vibration arms 22 and using silicon as the base material is referred to as "three-legged silicon resonator".

The temperature characteristic adjustment film 30 is constituted by a first silicon oxide ($SiO_2$) layer 31 and a second silicon oxide ($SiO_2$) layer 32, and the first silicon oxide layer 31 and the second silicon oxide layer 32 are stacked in this order from the surface silicon layer 13 side. That is, the first silicon oxide layer 31 is disposed on a first surface 10a on the opposite side to the surface on which the buried oxide film 12 is disposed of the surface silicon layer 13, and the second silicon oxide layer 32 is disposed on the opposite side to the surface silicon layer 13 of the first silicon oxide layer 31. The vibration arms 22 vibrate in a direction intersecting a plane passing through the three vibration arms 22. Therefore, the first surface 10a of the surface silicon layer 13 is a surface intersecting the vibration direction of the vibration arm 22.

The first silicon oxide layer 31 is formed by thermal oxidation of the surface silicon layer 13 by a thermal oxidation method, and the second silicon oxide layer 32 is formed by a CVD (Chemical Vapor Deposition) method or a sputtering method. Therefore, as compared with the first silicon oxide layer 31, the second silicon oxide layer 32 has more defects such as oxygen defects and is less dense, and therefore has a lower density. Accordingly, the etching rate (the etching amount per unit time) of the second silicon oxide layer 32 is larger than the etching rate of the first silicon oxide layer 31.

Here, when the thickness of the surface silicon layer 13 as the base material is represented by tsi, the thickness of the first silicon oxide layer 31 is represented by ta, and the thickness of the second silicon oxide layer 32 is represented by tb, the following relationships are satisfied: $0.138 \times tsi < ta < 0.268 \times tsi$ and $0.189 \times tsi < tb < 0.527 \times tsi$, preferably the following relationships are satisfied: $0.157 \times tsi < ta < 0.229 \times tsi$ and $0.226 \times tsi < tb < 0.451 \times tsi$, and more preferably the following relationships are satisfied: $0.176 \times tsi < ta < 0.191 \times tsi$ and $0.264 \times tsi < tb < 0.375 \times tsi$.

The piezoelectric drive section 40 includes a polysilicon film 41, a first electrode 42, a piezoelectric layer 43, a second electrode 44, and a plurality of wirings 45. The polysilicon film 41 is constituted by polysilicon which is not doped with impurities and may be constituted by, for example, amorphous silicon. In this embodiment, the polysilicon film 41 and the resonator body 20 cover the temperature characteristic adjustment film 30. According to this, the polysilicon film 41 can protect the temperature characteristic adjustment film 30 from etching of the silicon oxide layer around the piezoelectric drive section 40.

The first electrode 42 and the second electrode 44 are disposed so as to sandwich the piezoelectric layer 43. That is, the first electrode 42 disposed through the polysilicon film 41 on the opposite side to the first silicon oxide layer 31 of the second silicon oxide layer 32, the piezoelectric layer 43 disposed on the opposite side to the second silicon oxide layer 32 of the first electrode 42, and the second electrode 44 disposed on the opposite side to the first electrode 42 of the piezoelectric layer 43 are stacked in this order. In the example shown in FIGS. 1A to 1C, three sets of the first electrode 42, the piezoelectric layer 43, and the second electrode 44 are provided corresponding to the three vibration arms 22.

The plurality of wirings 45 are electrically connected to the first electrode 42 and the second electrode 44 so as to vibrate the adjacent vibration arms 22 in a reverse phase. Further, the plurality of wirings 45 are electrically connected to an electrode pad 46, and by externally applying a voltage between two electrode pads 46, the adjacent vibration arms 22 can be vibrated in a reverse phase.

As for the materials constituting these members, for example, the piezoelectric layer 43 is constituted by aluminum nitride (AlN) or the like, the first electrode 42 and the second electrode 44 are constituted by titanium nitride (TiN) or the like, and the plurality of wirings 45 and the electrode pad 46 are constituted by aluminum (Al), copper (Cu), or the like.

When a voltage is applied between the first electrode 42 and the second electrode 44 through the two electrode pads 46, the piezoelectric layer 43 expands and contracts accompanying this, and thus, the vibration arms 22 vibrate. This vibration is excited largely at a specific resonance frequency so as to minimize the impedance. As a result, an oscillator 100 (see FIG. 6) using this resonator 1 oscillates at an oscillation frequency mainly determined by the resonance frequency of the vibration arms 22.

Next, the temperature characteristic adjustment film 30 will be described in detail with reference to FIGS. 2 and 3.

Figure 2:
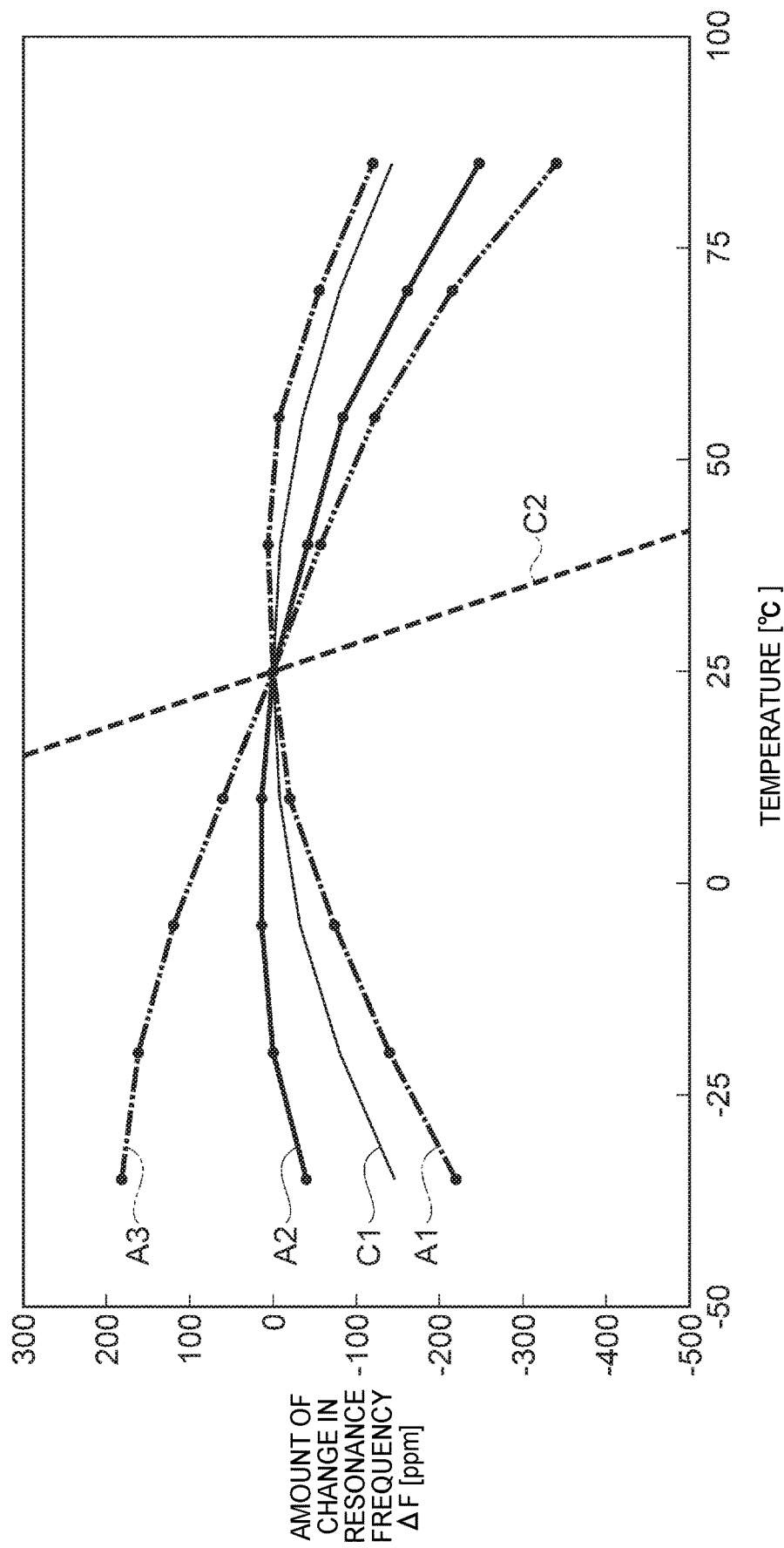
FIG. 2 is a graph showing the frequency temperature characteristics of various resonators.

FIG. 2 is a graph showing the frequency temperature characteristics of various resonators. FIG. 3 is a graph showing the relationship between the thickness of silicon oxide ($SiO_2$) and the primary temperature coefficient α.

The temperature characteristic adjustment film 30 is provided for correcting the temperature characteristic of the resonance frequency of the vibration arm 22. Silicon has a frequency temperature characteristic such that as the temperature increases, the resonance frequency decreases. On the other hand, silicon oxide has a frequency temperature characteristic such that as the temperature increases, the resonance frequency increases. Therefore, by disposing the temperature characteristic adjustment film 30 made of silicon oxide on the vibration arm 22 of the resonator body 20 made of silicon, the temperature characteristic of the resonance frequency of a complex composed of the vibration arm 22 of the resonator body 20 and the temperature characteristic adjustment film 30 can be made flatter.

FIG. 2 is a graph showing the frequency temperature characteristics (actual measured values) in a temperature range from −35° C. to +85° C. of various resonators by the amount of change in resonance frequency, and the horizontal axis represents the temperature (° C.), and the vertical axis represents the amount of change in resonance frequency ΔF (ppm) based on the resonance frequency at 25° C.

In FIG. 2, C1 indicates the frequency temperature characteristic of a tuning fork type quartz crystal resonator in which the resonator body 20 is constituted by quartz crystal, and C2 indicates the frequency temperature characteristic of a three-legged silicon resonator in which the resonator body 20 is constituted by silicon. While the frequency temperature characteristic of the three-legged silicon resonator is very steep, the frequency temperature characteristic of the tuning fork type quartz crystal resonator is flat in a temperature range from −25° C. to +75° C. such that the amount of change in resonance frequency ΔF is from 0 ppm to −180 ppm. The frequency temperature characteristic of the tuning fork type quartz crystal resonator indicated by C1 is such a level that the resonator can be utilized as a reference clock of an electronic apparatus or the like.

Further, A1 to A3 in FIG. 2 indicate the frequency temperature characteristics of three-legged silicon resonators in which the temperature characteristic adjustment film 30 is formed on the vibration arm 22. A1 is a three-legged silicon resonator including the temperature characteristic adjustment film 30 formed of a silicon oxide layer (corresponding to the first silicon oxide layer 31 in FIGS. 1B and 1C) with a thickness ta of 1 μm formed by a thermal oxidation method. A2 is a three-legged silicon resonator including the temperature characteristic adjustment film 30 formed of the following two layers: a silicon oxide layer (the first silicon oxide layer 31) with a thickness ta of 0.5 μm formed by a thermal oxidation method and a silicon oxide layer (corresponding to the second silicon oxide layer 32 in FIGS. 1B and 1C) with a thickness tb of 0.5 μm formed by a CVD method. A3 is a three-legged silicon resonator including the temperature characteristic adjustment film 30 formed of a silicon oxide layer (the second silicon oxide layer 32) with a thickness tb of 1 μm formed by a CVD method.

Therefore, from FIG. 2, it can be confirmed that the three-legged silicon resonators A1 to A3 in which the temperature characteristic adjustment film 30 is formed can largely correct the frequency temperature characteristic as compared with the three-legged silicon resonator C2 which does not include the temperature characteristic adjustment film 30, and can obtain a frequency temperature characteristic close to that of the tuning fork type quartz crystal resonator C1.

Figure 3:
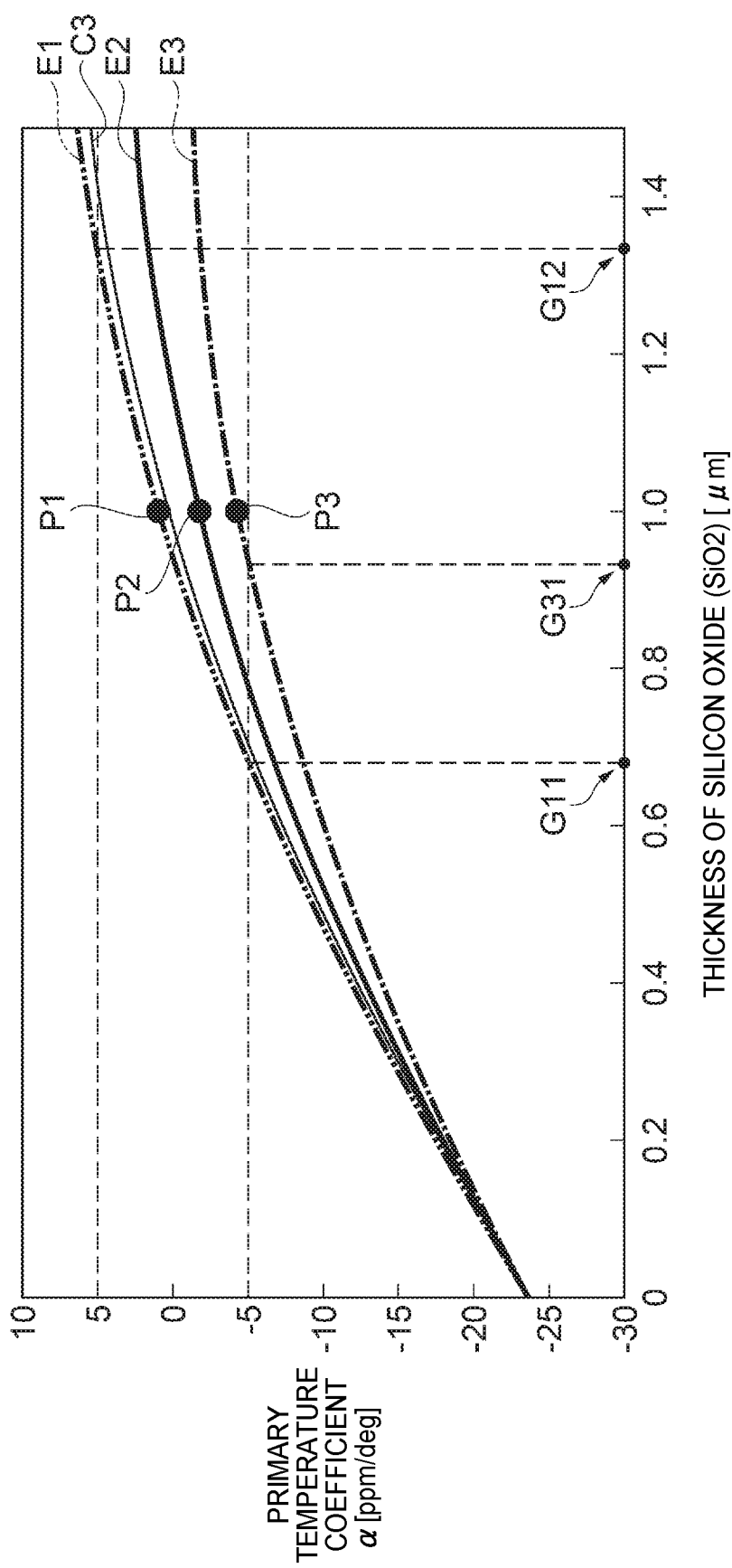
FIG. 3 is a graph showing the relationship between the thickness of silicon oxide ($SiO_2$) and a primary temperature coefficient $\alpha$.

Next, FIG. 3 is a graph showing the relationship between the thickness of silicon oxide ($SiO_2$) to become the temperature characteristic adjustment film 30 and the primary temperature coefficient α which greatly affects the frequency temperature characteristic in the temperature coefficient of frequency (TCF), and the horizontal axis represents the thickness (μm) of silicon oxide ($SiO_2$), and the vertical axis represents the primary temperature coefficient α (ppm/deg).

The curve C3 in FIG. 3 is the graph of an equation showing the relationship between the primary temperature coefficient α and the thickness of silicon oxide ($SiO_2$) calculated using the material constants of silicon and silicon oxide of the three-legged silicon resonator in which a silicon oxide ($SiO_2$) layer to serve as the temperature characteristic adjustment film 30 is formed, for example, the theoretical values of elasticity constant, density, linear expansion coefficient, etc. The thickness of the surface silicon layer of the three-legged silicon resonator used for the calculation is 5 μm, the length of the vibration arm 22 is 400 μm, the width thereof is 20 μm, the interval between the vibration arms 22 is 20 μm, the length of the silicon oxide layer to serve as the temperature characteristic adjustment film 30 is 200 μm, and the width thereof is 15 μm.

The plots P1 to P3 are obtained by plotting the primary temperature coefficients α (actual measured values) calculated from the frequency temperature characteristics of A1 to A3 in FIG. 2, and the curves E1 to E3 are equations passing through the plots P1 to P3 predicted from the curve C3. That is, the curve E1 is a predicted equation in the case where the temperature characteristic adjustment film 30 is formed of a silicon oxide layer (the first silicon oxide layer 31) formed by a thermal oxidation method, and the curve E3 is a predicted equation in the case where the temperature characteristic adjustment film 30 is formed of a silicon oxide layer (the second silicon oxide layer 32) formed by a CVD method. From the curves E1 to E3, the predicted equation (the curve E2) of the three-legged silicon resonator including the temperature characteristic adjustment film 30 formed of the following two layers: the first silicon oxide layer 31 formed by a thermal oxidation method and the second silicon oxide layer 32 formed by a CVD method of this embodiment passes through a region sandwiched by the curve E1 and the curve E3.

The first silicon oxide layer 31 is formed by thermal oxidation of the surface silicon layer 13, and therefore is dense, has few defects, and has a high density, and thus, the sensitivity to temperature-corrected film thickness (the amount of change in resonance frequency ΔF with respect to the film thickness) is high, and the slope of the curve E1 is steeper than that of the curve E3 of the second silicon oxide layer 32 formed by a CVD method. Due to this, the first silicon oxide layer 31 can be made thinner than the thickness of the second silicon oxide layer 32 in order to obtain the same primary temperature coefficient α. However, the first silicon oxide layer 31 has high sensitivity to temperature-corrected film thickness, and therefore, it is difficult to control the film thickness, and thus, there is a fear that the variation in the primary temperature coefficient α may be increased.

On the other hand, the second silicon oxide layer 32 formed by a CVD method has many defects and has a low density, and therefore has low sensitivity to temperature-corrected film thickness, and thus, it is easy to control the film thickness. Due to this, by stacking the second silicon oxide layer 32 on the first silicon oxide layer 31, in which it is difficult to control the film thickness and a variation in the primary temperature coefficient α is likely to occur to form the temperature characteristic adjustment film 30, the variation in the primary temperature coefficient α due to the first silicon oxide layer 31 can be reduced, and thus, the three-legged silicon resonator (resonator 1) having a small primary temperature coefficient α and also having a small variation in the primary temperature coefficient α so as to have an excellent frequency temperature characteristic can be obtained. The same applies to the case where a sputtering method is used in place of the CVD method.

From FIG. 3, the thickness of the temperature characteristic adjustment film 30, with which the amount of change in resonance frequency ΔF in a temperature range from −25° C. to +75° C. of the three-legged silicon resonator including the temperature characteristic adjustment film 30 is ±500 ppm, is the thickness of silicon oxide which is obtained when the curves E1 and E3 intersect at a primary temperature coefficient α of 5 ppm/deg and −5 ppm/deg. In the case of the curve E1, for which the temperature characteristic adjustment film 30 includes only the first silicon oxide layer 31, a thickness G11 which is obtained when the curve E1 intersects at a primary temperature coefficient α of −5 ppm/deg is the lower limit, and a thickness G12 which is obtained when the curve E1 intersects at a primary temperature coefficient α of 5 ppm/deg is the upper limit. The lower limit (G11) of the thickness ta of the first silicon oxide layer 31 is 0.690 μm, and the upper limit (G12) of the thickness ta of the first silicon oxide layer 31 is 1.341 μm. In the case of the curve E3, for which the temperature characteristic adjustment film 30 includes only the second silicon oxide layer 32, the lower limit (G31) of the thickness tb of the second silicon oxide layer 32 is 0.943 μm, and the upper limit (obtained by calculation) of the thickness tb of the second silicon oxide layer 32 is 2.629 μm.

When the lower limit and the upper limit of the thickness ta of the first silicon oxide layer 31, and the lower limit and the upper limit of the thickness tb of the second silicon oxide layer 32 are normalized by the thickness tsi (5 μm) of the surface silicon layer 13 to be the thickness of the vibration arm 22, the lower limit and the upper limit of the thickness ta of the first silicon oxide layer 31 are 0.138×tsi and 0.268×tsi, respectively, and the lower limit and the upper limit of the thickness tb of the second silicon oxide layer 32 are 0.189×tsi and 0.527×tsi, respectively.

Accordingly, in the case of this embodiment in which the temperature characteristic adjustment film 30 is constituted by the first silicon oxide layer 31 and the second silicon oxide layer 32, by setting the thickness ta of the first silicon oxide layer 31 larger than 0.138×tsi and smaller than 0.268×tsi, and setting the thickness tb of the second silicon oxide layer 32 larger than 0.189×tsi and smaller than 0.527×tsi, the three-legged silicon resonator (resonator 1) having an excellent frequency temperature characteristic such that the amount of change in resonance frequency ΔF in a temperature range from −25° C. to +75° C. is within ±500 ppm can be obtained.

Next, the thickness of the temperature characteristic adjustment film 30, with which the amount of change in resonance frequency ΔF in a temperature range from −25° C. to +75° C. of the three-legged silicon resonator including the temperature characteristic adjustment film 30 is ±300 ppm, is the thickness of silicon oxide which is obtained when the curves E1 and E3 intersect at a primary temperature coefficient α of 3 ppm/deg and −3 ppm/deg in the same manner as in the case where the amount of change in resonance frequency ΔF is ±500 ppm.

Therefore, the lower limit and the upper limit of the thickness ta of the first silicon oxide layer 31 are 0.785 μm (0.157×tsi) and 1.147 μm (0.229×tsi), respectively, and the lower limit and the upper limit of the thickness tb of the second silicon oxide layer 32 are 1.132 μm (0.226×tsi) and 2.253 μm (0.451×tsi), respectively.

Accordingly, in the case of this embodiment in which the temperature characteristic adjustment film 30 is constituted by the first silicon oxide layer 31 and the second silicon oxide layer 32, by setting the thickness ta of the first silicon oxide layer 31 larger than 0.157×tsi and smaller than 0.229×tsi, and setting the thickness tb of the second silicon oxide layer 32 larger than 0.226×tsi and smaller than 0.451×tsi, the three-legged silicon resonator (resonator 1) having an excellent frequency temperature characteristic such that the amount of change in resonance frequency ΔF in a temperature range from −25° C. to +75° C. is within ±300 ppm can be obtained.

Further, the thickness of the temperature characteristic adjustment film 30, with which the amount of change in resonance frequency ΔF in a temperature range from −25° C. to +75° C. of the three-legged silicon resonator including the temperature characteristic adjustment film 30 is ±100 ppm, is the thickness of silicon oxide which is obtained when the curves E1 and E3 intersect at a primary temperature coefficient α of 1 ppm/deg and −1 ppm/deg in the same manner as in the case where the amount of change in resonance frequency ΔF is ±500 ppm and ±300 ppm.

Therefore, the lower limit and the upper limit of the thickness ta of the first silicon oxide layer 31 are 0.880 μm (0.176×tsi) and 0.953 μm (0.191×tsi), respectively, and the lower limit and the upper limit of the thickness tb of the second silicon oxide layer 32 are 1.321 μm (0.264×tsi) and 1.876 μm (0.375×tsi), respectively.

Accordingly, in the case of this embodiment in which the temperature characteristic adjustment film 30 is constituted by the first silicon oxide layer 31 and the second silicon oxide layer 32, by setting the thickness ta of the first silicon oxide layer 31 larger than 0.176×tsi and smaller than 0.191×tsi, and setting the thickness tb of the second silicon oxide layer 32 larger than 0.264×tsi and smaller than 0.375×tsi, the three-legged silicon resonator (resonator 1) having an excellent frequency temperature characteristic such that the amount of change in resonance frequency ΔF in a temperature range from −25° C. to +75° C. is within ±100 ppm can be obtained.

In this embodiment, the three-legged silicon resonator 1 including three vibration arms 22 has been described as one example, however, the number of vibration arms 22 extending from the fixing section 21 is not limited thereto.

As described above, in the resonator 1 including the temperature characteristic adjustment film 30 according to this embodiment, the temperature characteristic adjustment film 30 in which the first silicon oxide layer 31 and the second silicon oxide layer 32 are stacked is formed on the surface silicon layer 13, and therefore, as compared with the control of the film thickness for correcting the temperature coefficient of frequency (TCF) by one silicon oxide layer, the control of the film thickness becomes easier, and the variation in the frequency temperature characteristic can be reduced. Further, when the thickness of the surface silicon layer 13 is represented by tsi, and the thickness ta of the first silicon oxide layer 31 and the thickness tb of the second silicon oxide layer 32 are set so as to satisfy the following relationships: $0.138 \times tsi < ta < 0.268 \times tsi$ and $0.189 \times tsi < tb < 0.527 \times tsi$, the primary temperature coefficient α can be decreased, and thus, the resonator 1 having an excellent frequency temperature characteristic such that the amount of change in resonance frequency ΔF in a temperature range from −25° C. to +75° C. is within ±500 ppm can be obtained.

Further, by satisfying the following relationships: $0.157 \times tsi < ta < 0.229 \times tsi$ and $0.226 \times tsi < tb < 0.451 \times tsi$, the primary temperature coefficient α can be further decreased, and thus, the resonator 1 having a more excellent frequency temperature characteristic such that the amount of change in resonance frequency ΔF in a temperature range from −25° C. to +75° C. is within ±300 ppm can be obtained.

Further, by satisfying the following relationships: $0.176 \times tsi < ta < 0.191 \times tsi$ and $0.264 \times tsi < tb < 0.375 \times tsi$, the primary temperature coefficient α can be still further decreased, and thus, the resonator 1 having a still more excellent frequency temperature characteristic such that the amount of change in resonance frequency ΔF in a temperature range from −25° C. to +75° C. is within ±100 ppm can be obtained.

Further, since the second silicon oxide layer 32 has a lower density than the first silicon oxide layer 31, the variation in the film thickness of the first silicon oxide layer 31, in which the density is high and it is difficult to control the film thickness, can be corrected by the second silicon oxide layer 32, in which the density is low and it is easy to control the film thickness. Due to this, the variation in the primary temperature coefficient α and the variation in the frequency temperature characteristic accompanying the variation in the film thickness of the first silicon oxide layer 31 can be reduced.

Further, since the etching rate of the second silicon oxide layer 32 is larger than the etching rate of the first silicon oxide layer 31, even if the film thickness of the second silicon oxide layer 32 is made thicker than the film thickness of the first silicon oxide layer 31, an etching time of the second silicon oxide layer 32 is not prolonged, and the tact time in etching can be reduced, and thus, the productivity can be improved.

Further, by forming the first silicon oxide layer 31 and the second silicon oxide layer 32 in a stacked manner on the surface intersecting the vibration direction of the surface silicon layer 13, the primary temperature coefficient α of the resonator 1 can be more effectively changed, and thus, the resonator 1 having an excellent frequency temperature characteristic can be easily obtained.

Further, by stacking the first electrode 42, the piezoelectric layer 43, and the second electrode 44 in this order on the second silicon oxide layer 32, the resonator 1 can be stably vibrated in a direction intersecting the first surface 10a of the surface silicon layer 13 to become the vibration arm 22, and thus, the resonator 1 having an excellent frequency temperature characteristic can be obtained.

Production Method

Next, a process for producing the resonator 1 according to this embodiment will be described with reference to FIGS. 4A to 4D and FIGS. 5A to 5H.

Figure 4A:
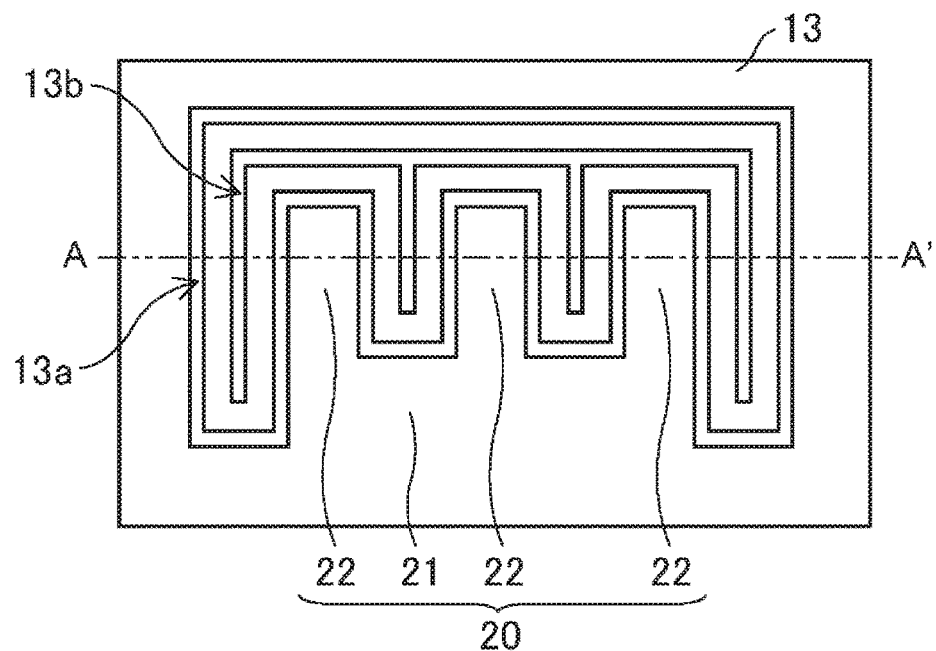
FIG. 4A is a schematic plan view showing a process for producing the resonator according to the embodiment.

FIGS. 4A to 4D are schematic plan views showing the process for producing the resonator 1 according to this embodiment. FIGS. 5A to 5H are schematic cross-sectional views corresponding to the position of the line A-A' of FIG. 4A showing the process for producing the resonator 1 according to this embodiment. The lines indicating the background of the cross section are omitted.

First, as a preparation step, as shown in FIGS. 1B and 1C or the like, the SOI substrate 10 in which the silicon substrate 11, the buried oxide film 12, and the surface silicon layer 13 are stacked in this order is prepared. Alternatively, the SOI substrate 10 may be formed by forming the buried oxide film 12 on the silicon substrate 11, and then forming the surface silicon layer 13 on the buried oxide film 12. In this embodiment, the surface silicon layer 13 corresponds to the base material.

Subsequently, in a first step, as shown in FIG. 4A, the trench 13a which separates a region to become the vibration arm 22 of the resonator body 20 from the surrounding silicon other than a region to become the fixing section 21 of the resonator body 20 is formed. At this time, a slit 13b may be formed in a region separated from the vibration arm 22 of the resonator body 20 by the trench 13a of the surface silicon layer 13 of the SOI substrate 10. By doing this, it is possible to facilitate the release etching of silicon around the vibration arm 22 which is performed later.

Figure 5A:
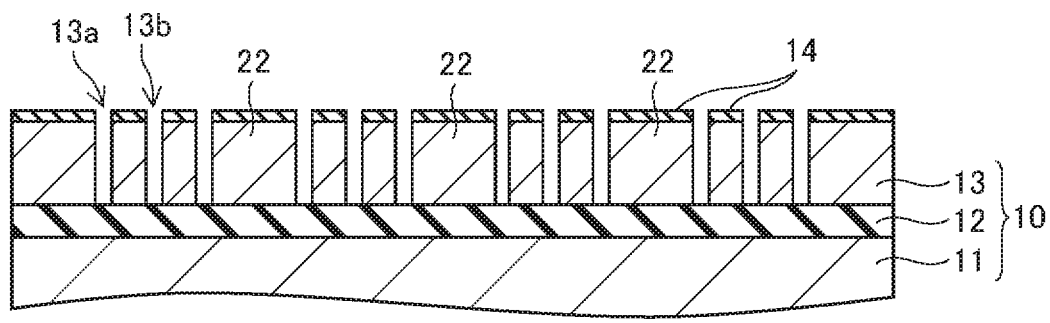
FIG. 5A is a schematic cross-sectional view corresponding to the position of the line A-A' of FIG. 4A showing the process for producing the resonator according to the embodiment.

As for the formation of the trench 13a, a photoresist 14 is coated on the surface silicon layer 13, a mask pattern is formed by photolithography, and the surface silicon layer 13 is etched using the photoresist 14 as a mask, whereby the trench 13a which separates a region to become the vibration arm 22 of the resonator body 20 from the surrounding silicon other than a region to become the fixing section 21 of the resonator body 20 is formed on the surface silicon layer 13 as shown in FIG. 5A. It is also possible to form the trench 13a as follows: a silicon oxide layer is formed by thermal oxidation of the surface of the surface silicon layer 13 of the SOI substrate 10, and a mask is formed with the silicon oxide layer by photolithography, and then, the surface silicon layer 13 is etched.

Figure 5B:
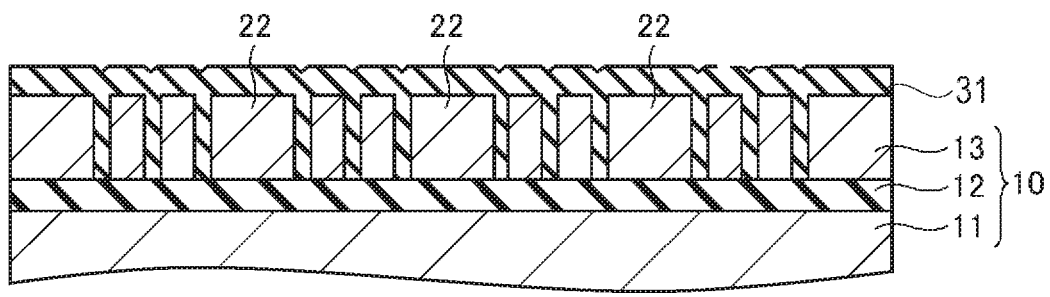
FIG. 5B is a schematic cross-sectional view corresponding to the position of the line A-A' of FIG. 4A showing the process for producing the resonator according to the embodiment.

In a second step, as shown in FIG. 5B, the first silicon oxide layer 31 to become a part of the temperature characteristic adjustment film 30 is formed on the upper surface of the surface silicon layer 13 and the side wall in the trench 13a by thermal oxidation of the surface silicon layer 13 of the SOI substrate 10.

Figure 5C:
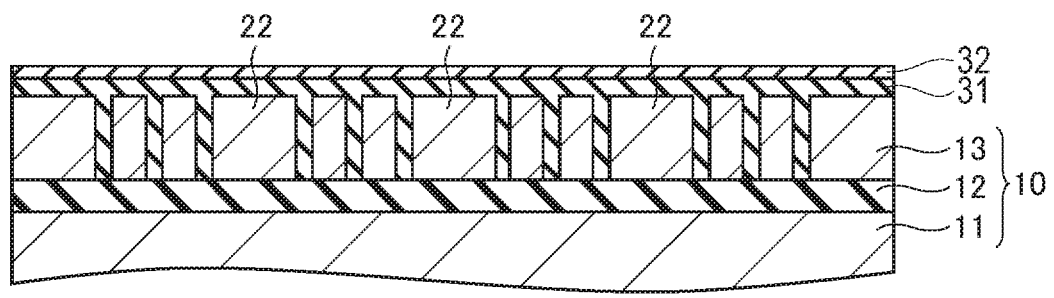
FIG. 5C is a schematic cross-sectional view corresponding to the position of the line A-A' of FIG. 4A showing the process for producing the resonator according to the embodiment.

Subsequently, in a third step, as shown in FIG. 5C, the second silicon oxide layer 32 to become a part of the temperature characteristic adjustment film 30 is formed on the first silicon oxide layer 31 by a CVD method or a sputtering method.

Figure 4B:
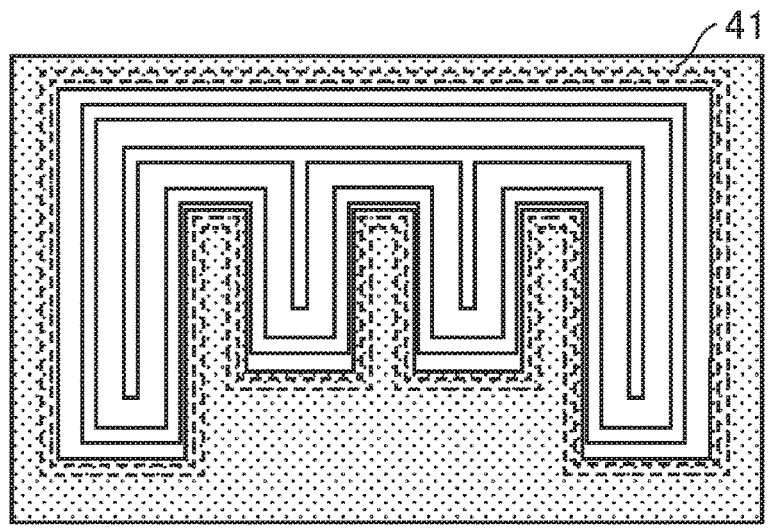
FIG. 4B is a schematic plan view showing the process for producing the resonator according to the embodiment.
Figure 5D:
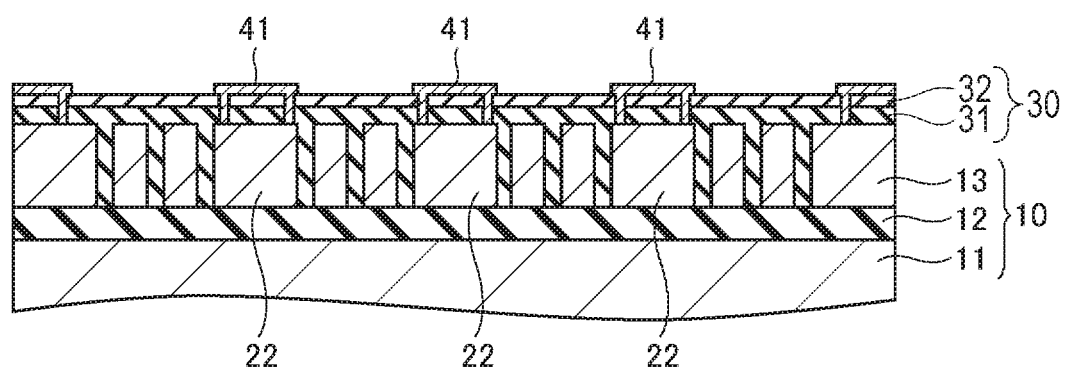
FIG. 5D is a schematic cross-sectional view corresponding to the position of the line A-A' of FIG. 4A showing the process for producing the resonator according to the embodiment.

In a fourth step, a photoresist is coated on the second silicon oxide layer 32, a mask pattern is formed by photolithography, and the second silicon oxide layer 32 and the first silicon oxide layer 31 are etched using the photoresist as a mask, whereby a trench reaching the resonator body 20 is formed. Thereafter, the polysilicon film 41 covering the upper surface of the second silicon oxide layer 32 and the side wall of the trench of the first silicon oxide layer 31 is formed by a CVD method or a sputtering method, and the polysilicon film 41 is formed on a predetermined region of the resonator body 20 including the vibration arm 22 as shown in FIGS. 4B and 5D by photolithography.

Figure 5E:
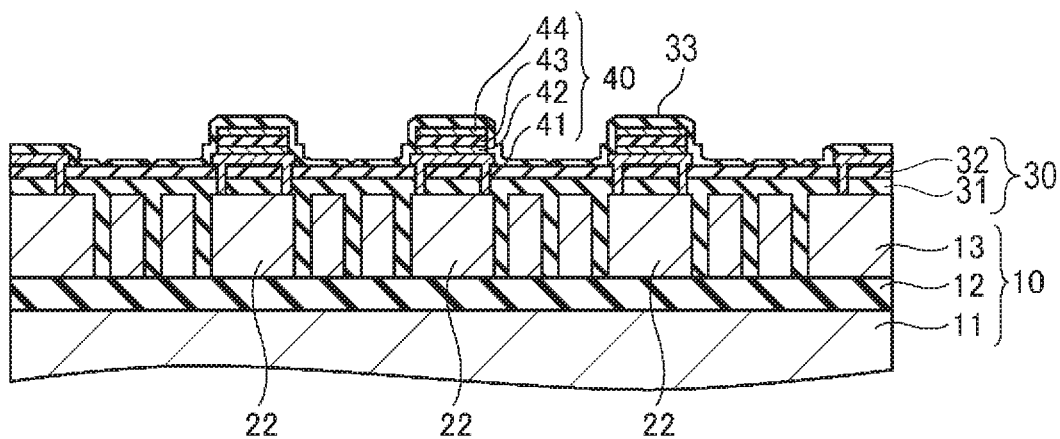
FIG. 5E is a schematic cross-sectional view corresponding to the position of the line A-A' of FIG. 4A showing the process for producing the resonator according to the embodiment.

In a fifth step, on the polysilicon film 41 formed in the predetermined region of the resonator body 20, the first electrode 42, the piezoelectric layer 43, and the second electrode 44 are formed in this order by photolithography. The members from the polysilicon film 41 to the second electrode 44 constitute the piezoelectric drive section 40. Thereafter, as shown in FIG. 5E, on the SOI substrate 10 on which the piezoelectric drive section 40 is formed, a third silicon oxide layer 33 is formed by a CVD method or a sputtering method. The first to third silicon oxide layers 31, 32, and 33 protect the vibration arm 22 and the piezoelectric drive section 40 from release etching of silicon around the vibration arm 22 which is performed later.

Figure 4C:
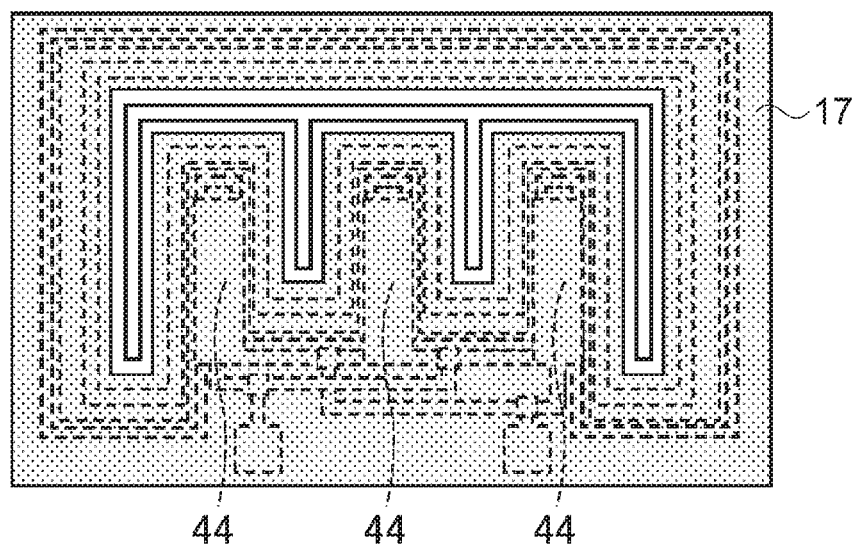
FIG. 4C is a schematic plan view showing the process for producing the resonator according to the embodiment.
Figure 5F:
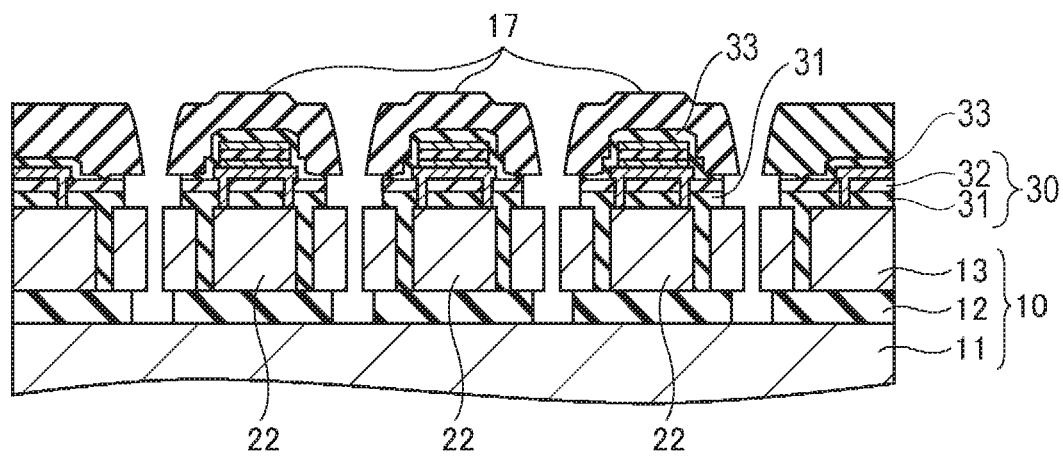
FIG. 5F is a schematic cross-sectional view corresponding to the position of the line A-A' of FIG. 4A showing the process for producing the resonator according to the embodiment.

In a sixth step, as shown in FIGS. 4C and 5F, on the third silicon oxide layer 33, a photoresist 17 is coated, and a mask pattern is formed by photolithography, and then, the first to third silicon oxide layers 31, 32, and 33 are etched using the photoresist 17 as a mask. By doing this, an opening with a depth reaching the silicon substrate 11 is formed into a shape so as to surround the periphery of the vibration arm 22 while leaving the first to third silicon oxide layers 31, 32, and 33 which protect the vibration arm 22 and the piezoelectric drive section 40.

At this time, when the photoresist 17 having an opening which maintains a predetermined distance between the vibration arms 22 is provided, the first to third silicon oxide layers 31, 32, and 33 which protect the vibration arm 22 and the piezoelectric drive section 40 can be left at the time of performing etching of silicon around the vibration arm 22. Further, in the case where the slit 13b is formed on the surface silicon layer 13, the opening reaches the buried oxide film 12, and therefore, the buried oxide film 12 of the SOI substrate 10 can be etched along with the first to third silicon oxide layers 31, 32, and 33.

Figure 5G:
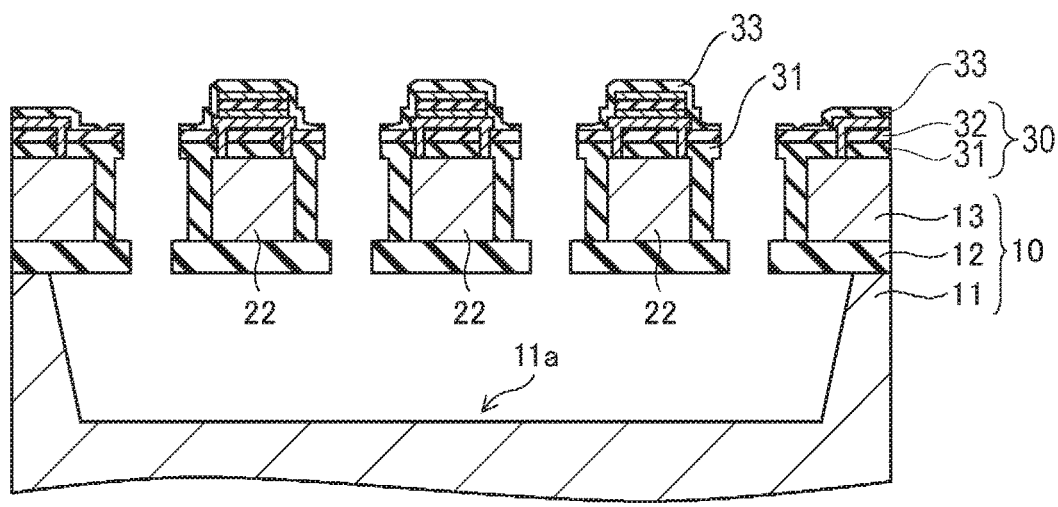
FIG. 5G is a schematic cross-sectional view corresponding to the position of the line A-A' of FIG. 4A showing the process for producing the resonator according to the embodiment.

In a seventh step, as shown in FIG. 5G, after the photoresist 17 is peeled, silicon around the vibration arm 22 is etched (release etching) through the opening of the first to third silicon oxide layers 31, 32, and 33. At this time, the silicon of the silicon substrate 11 is partially etched, a cavity 11a is formed in the silicon substrate 11 below the vibration arm 22. In the seventh step, wet etching is performed, and as an etching liquid, for example, TMAH (tetramethylammonium hydroxide) is used.

Figure 4D:
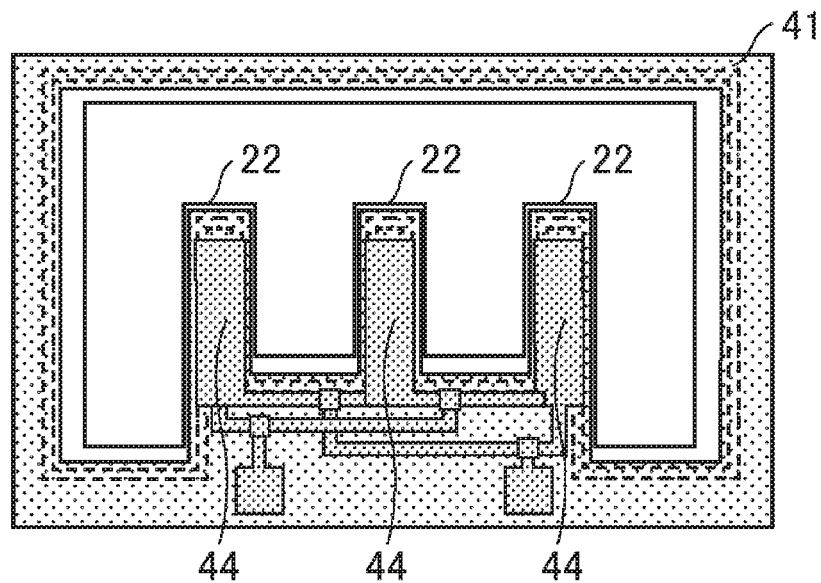
FIG. 4D is a schematic plan view showing the process for producing the resonator according to the embodiment.
Figure 5H:
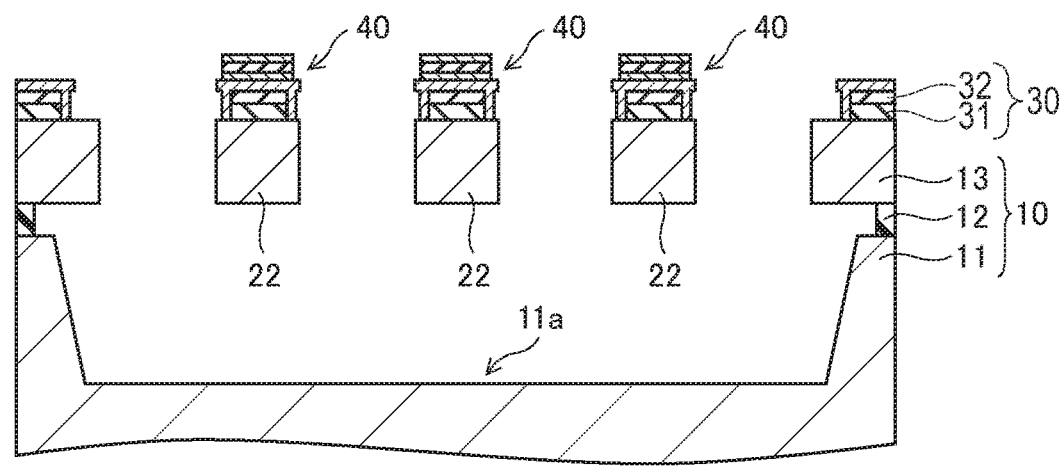
FIG. 5H is a schematic cross-sectional view corresponding to the position of the line A-A' of FIG. 4A showing the process for producing the resonator according to the embodiment.

In an eighth step, as shown in FIGS. 4D and 5H, the first to third silicon oxide layers 31, 32, and 33, and the buried oxide film 12 around the vibration arm 22 and the piezoelectric drive section 40 are etched (release etching). By doing this, only on the vibration arm 22, the temperature characteristic adjustment film 30 having a stacked structure of the first silicon oxide layer 31 and the second silicon oxide layer 32 is left. In the eighth step, wet etching is performed, and as an etching liquid, for example, BHF (buffered hydrofluoric acid) is used. As a result, the resonator 1 as shown in FIGS. 1A to 1C can be obtained.

Oscillator

Next, the oscillator 100 including the resonator 1 according to the invention will be described.

Figure 6:
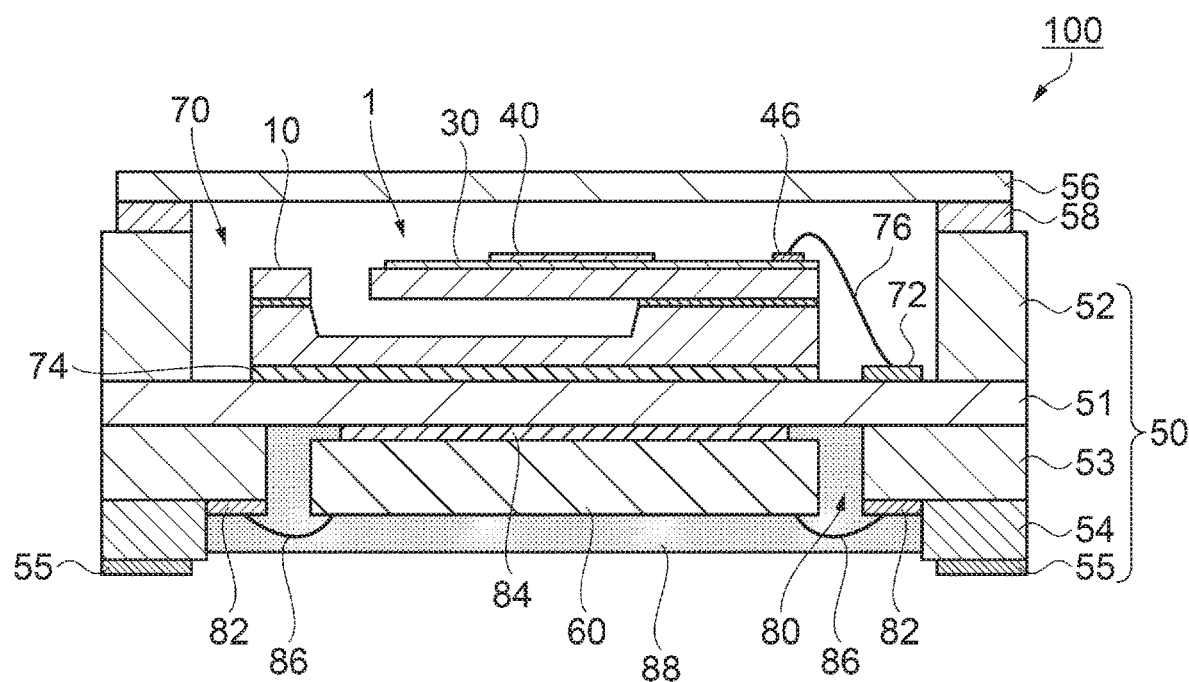
FIG. 6 is a schematic cross-sectional view showing a configuration of an oscillator including the resonator according to the invention.

FIG. 6 is a schematic cross-sectional view showing a configuration of the oscillator 100 including the resonator 1 according to the invention.

The oscillator 100 is constituted by the resonator 1, a package body 50 which houses the resonator 1, an IC chip (chip component) 60 including an oscillation circuit for oscillating the resonator 1, and a lid member 56 composed of a glass, a ceramic, a metal, or the like. The inside of a cavity 70 in which the resonator 1 is placed is a depressurized space which is almost vacuum.

The package body 50 is formed by stacking a first substrate 51, a second substrate 52, a third substrate 53, a fourth substrate 54, and a mounting terminal 55 as shown in FIG. 6. Further, the package body 50 has the cavity 70 which opens on the resonator 1 side and a cavity 80 which opens on the IC chip 60 side.

A plurality of mounting terminals 55 are provided on the surface on the opposite side to the third substrate 53 side of the fourth substrate 54. Further, the mounting terminal 55 is electrically conducted to a connection electrode 72 provided on the surface on the second substrate 52 side of the first substrate 51 or a connection electrode 82 provided on the surface on the fourth substrate 54 side of the third substrate 53 through a through electrode (not shown) or an interlayer wiring (not shown).

In the cavity 70 of the package body 50, the resonator 1 is bonded to the surface on the second substrate 52 side of the first substrate 51 through a bonding member 74 such as an adhesive, and the electrode pad 46 provided in the resonator 1 and the connection electrode 72 provided on the surface on the second substrate 52 side of the first substrate 51 are electrically connected through a bonding wire 76. Further, the inside of the cavity 70 is airtightly sealed by bonding the lid member 56 through a sealing member 58 made of borosilicate glass or the like.

On the other hand, in the cavity 80 of the package body 50, the IC chip 60 is placed, and this IC chip 60 is fixed to the surface on the third substrate 53 side of the first substrate 51 through a bonding member 84 such as a brazing material or an adhesive. Further, in the cavity 80, at least two connection electrodes 82 are provided. The connection electrode 82 is electrically connected to the IC chip 60 through a bonding wire 86. The inside of the cavity 80 is filled with a resin material 88, and by this resin material 88, the IC chip 60 is sealed.

The IC chip 60 includes an oscillation circuit for controlling the oscillation of the resonator 1, and by applying a voltage to the resonator 1 by this oscillation circuit through the connection electrode 82, the resonator 1 is oscillated, and a predetermined oscillation frequency can be output.

Therefore, by including the resonator 1 having an excellent frequency temperature characteristic, the oscillator 100 having high performance can be obtained.

Electronic Apparatus

Next, electronic apparatuses to which the resonator 1 according to an embodiment of the invention is applied will be described with reference to FIGS. 7, 8, and 9.

Figure 7:
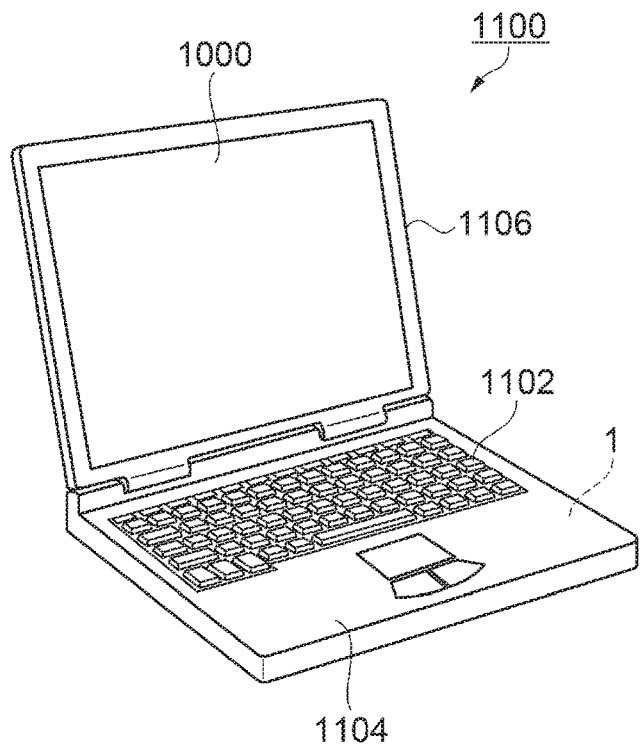
FIG. 7 is a perspective view showing a configuration of a mobile-type (or notebook-type) personal computer as an electronic apparatus including the resonator according to the invention.

FIG. 7 is a perspective view showing an outline of a configuration of a mobile-type (or notebook-type) personal computer as the electronic apparatus including the resonator 1 according to this embodiment. In this drawing, a personal computer 1100 is constituted by a main body 1104 provided with a keyboard 1102 and a display unit 1106 provided with a display 1000, and the display unit 1106 is supported rotatably with respect to the main body 1104 through a hinge structure. In such a personal computer 1100, the resonator 1 which functions as a reference clock or the like is included.

Figure 8:
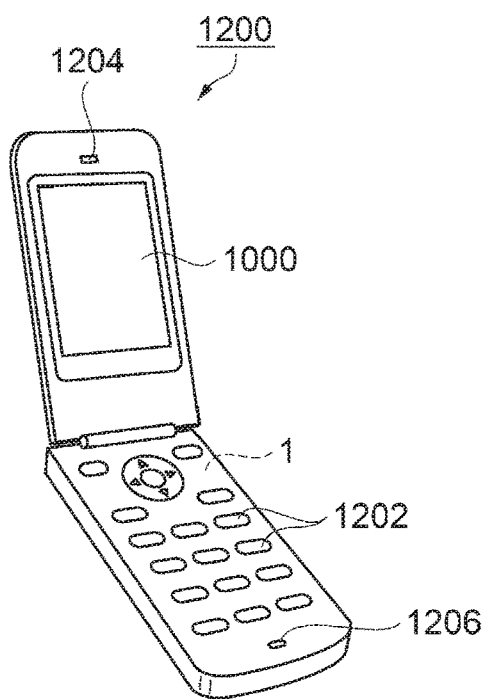
FIG. 8 is a perspective view showing a configuration of a mobile phone as an electronic apparatus including the resonator according to the invention.

FIG. 8 is a perspective view showing an outline of a configuration of a mobile phone (also including a PHS (Personal Handy-phone System) and a smartphone) as an electronic apparatus including the resonator 1 according to an embodiment of the invention. In this drawing, a mobile phone 1200 includes a plurality of operation buttons 1202, an earpiece 1204, and a mouthpiece 1206, and a display 1000 is disposed between the operation buttons 1202 and the earpiece 1204. In such a mobile phone 1200, the resonator 1 which functions as a reference clock or the like is included.

Figure 9:
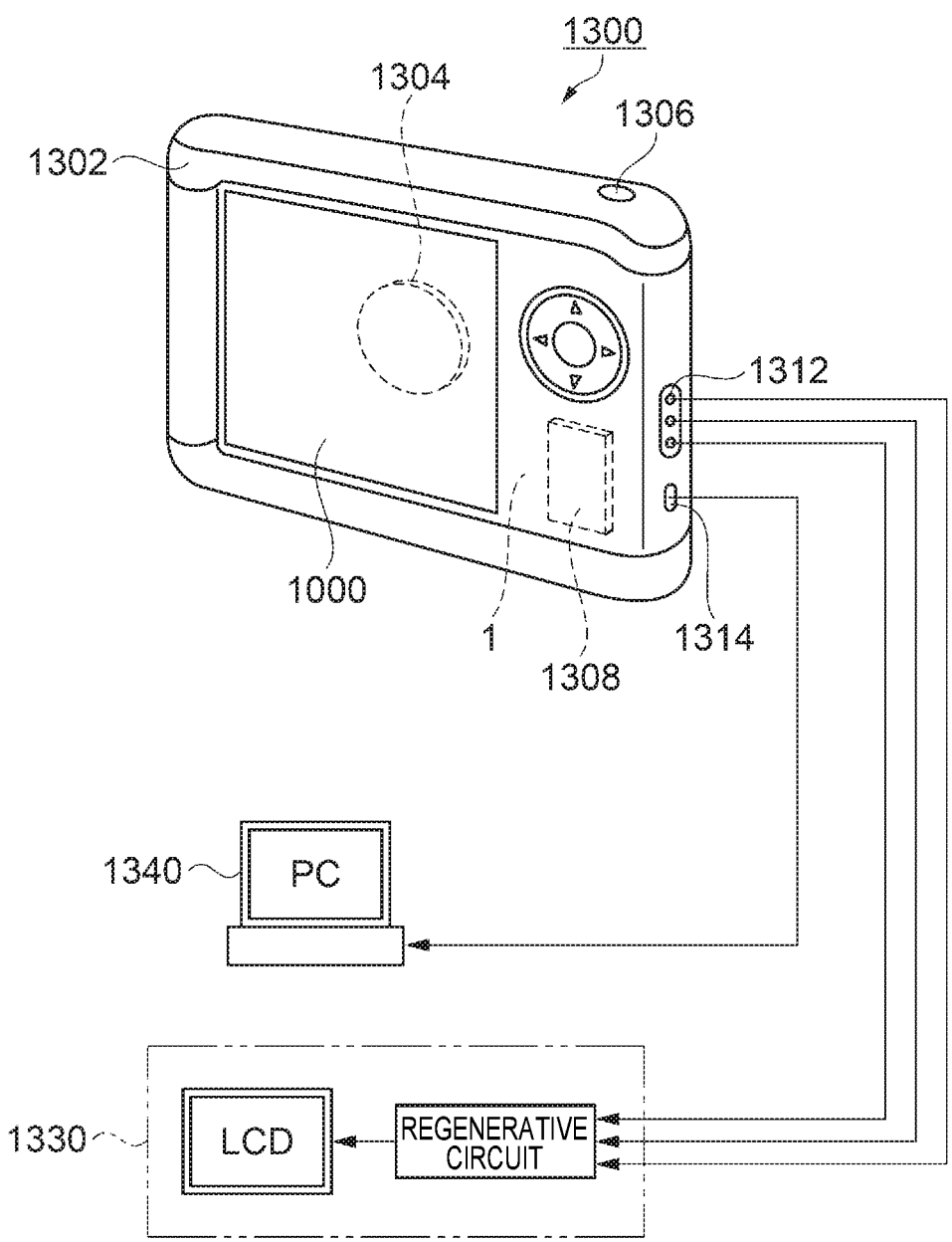
FIG. 9 is a perspective view showing a configuration of a digital camera as an electronic apparatus including the resonator according to the invention.

FIG. 9 is a perspective view showing an outline of a configuration of a digital still camera as an electronic apparatus including the resonator 1 according to an embodiment of the invention. In this drawing, connection to an external apparatus is also briefly shown. A digital still camera 1300 generates an imaging signal (image signal) by performing photoelectric conversion of an optical image of a subject using an imaging element such as a CCD (Charge Coupled Device).

A display 1000 is provided on the back surface of a case (body) 1302 in the digital still camera 1300 and is configured to perform display based on the imaging signal of the CCD.

The display 1000 functions as a viewfinder that displays a subject as an electronic image. In addition, a light receiving unit 1304 including an optical lens (imaging optical system), a CCD, and the like is provided on the front side (back side in the drawing) of the case 1302.

When a photographer checks a subject image displayed on the display 1000 and presses a shutter button 1306, an imaging signal of the CCD at that time point is transferred to and stored in a memory 1308. In addition, in this digital still camera 1300, a video signal output terminal 1312 and an input/output terminal for data communication 1314 are provided on the side surface of the case 1302. Further, as shown in the drawing, a television monitor 1330 is connected to the video signal output terminal 1312 and a personal computer 1340 is connected to the input/output terminal for data communication 1314 as needed. In addition, it is configured such that an imaging signal stored in the memory 1308 is output to the television monitor 1330 or the personal computer 1340 by a predetermined operation. In such a digital still camera 1300, the resonator 1 which functions as a reference clock or the like is included.

As described above, by utilizing the resonator 1 having an excellent frequency temperature characteristic in an electronic apparatus, the electronic apparatus having a higher performance can be provided.

The resonator 1 according to an embodiment of the invention can be applied not only to the personal computer 1100 (mobile-type personal computer) shown in FIG. 7, the mobile phone 1200 shown in FIG. 8, and the digital still camera 1300 shown in FIG. 9, but also, for example, to electronic apparatuses such as an inkjet-type discharge apparatus (for example, an inkjet printer), a laptop-type personal computer, a television, a video camera, a car navigation apparatus, a pager, an electronic organizer (also including an electronic organizer with a communication function), an electronic dictionary, an electronic calculator, an electronic game machine, a workstation, a video phone, a television monitor for crime prevention, electronic binoculars, a POS (Point of Sale) terminal, a medical device (for example, an electronic thermometer, a sphygmomanometer, a blood sugar meter, an electrocardiographic monitoring device, an ultrasonic diagnostic device, and an electronic endoscope), a fish finder, various measurement apparatuses, meters (for example, meters for vehicles, aircrafts, and ships), and a flight simulator.

Vehicle

Next, a vehicle to which the resonator 1 according to an embodiment of the invention is applied will be described with reference to FIG. 10.

Figure 10:
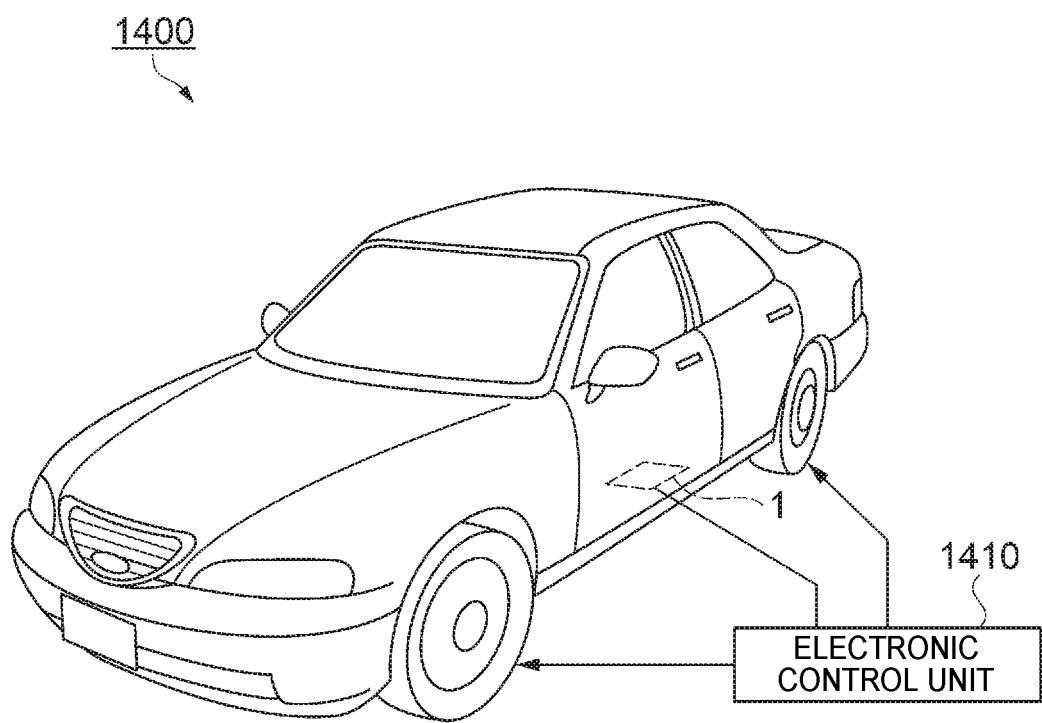
FIG. 10 is a perspective view showing a configuration of a car as a vehicle including the resonator according to the invention.

FIG. 10 is a perspective view schematically showing a car 1400 as an example of the vehicle according to the invention.

On the car 1400, the resonator 1 is mounted. The resonator 1 can be widely applied to an electronic control unit (ECU) 1410 such as a keyless entry, an immobilizer, a car navigation system, an air conditioner, an anti-lock brake system (ABS), an airbag, a tire pressure monitoring system (TPMS), an engine control, a battery monitor for a hybrid car or an electrical car, or a car body posture control system.

As described above, by utilizing the resonator 1 having an excellent frequency temperature characteristic in a vehicle, the vehicle having a higher performance can be provided.

Hereinabove, the resonator 1, the oscillator 100, the electronic apparatuses 1100, 1200, and 1300, and the vehicle 1400 according to the invention have been described with reference to the embodiments shown in the drawings, however, the invention is not limited thereto, and the configuration of each part can be replaced with an arbitrary configuration having the same function. Further, in the invention, another arbitrary structure may be added to the invention. In addition, the above-mentioned embodiments may be appropriately combined.

What is claimed is:

1. A resonator, comprising:
   a base material;
   a first silicon oxide layer disposed on a first surface of the base material; and
   a second silicon oxide layer disposed on the opposite side to the base material of the first silicon oxide layer, wherein
   when the thickness of the base material is represented by tsi, the thickness of the first silicon oxide layer is represented by ta, and the thickness of the second silicon oxide layer is represented by tb, the following relationships are satisfied: $0.138 \times tsi < ta < 0.268 \times tsi$ and $0.189 \times tsi < tb < 0.527 \times tsi$.

2. The resonator according to claim 1, wherein the following relationships are satisfied: $0.157 \times tsi < ta < 0.229 \times tsi$ and $0.226 \times tsi < tb < 0.451 \times tsi$.

3. The resonator according to claim 1, wherein the following relationships are satisfied: $0.176 \times tsi < ta < 0.191 \times tsi$ and $0.264 \times tsi < tb < 0.375 \times tsi$.

4. The resonator according to claim 1, wherein the second silicon oxide layer has a lower density than the first silicon oxide layer.

5. The resonator according to claim 1, wherein the etching rate of the second silicon oxide layer is larger than the etching rate of the first silicon oxide layer.

6. The resonator according to claim 1, wherein the first surface is a surface intersecting the vibration direction of the base material.

7. The resonator according to claim 1, further comprising:
   a first electrode disposed on the opposite side to the first silicon oxide layer of the second silicon oxide layer;
   a piezoelectric layer disposed on the opposite side to the second silicon oxide layer of the first electrode; and
   a second electrode disposed on the opposite side to the first electrode of the piezoelectric layer.

8. An oscillator, comprising:
   the resonator according to claim 1; and
   an oscillation circuit which oscillates the resonator.

9. An oscillator, comprising:
   the resonator according to claim 2; and
   an oscillation circuit which oscillates the resonator.

10. An oscillator, comprising:
    the resonator according to claim 3; and
    an oscillation circuit which oscillates the resonator.

11. An oscillator, comprising:
    the resonator according to claim 4; and
    an oscillation circuit which oscillates the resonator.

12. An oscillator, comprising:
    the resonator according to claim 5; and
    an oscillation circuit which oscillates the resonator.

13. An electronic apparatus comprising the resonator according to claim 1.

14. An electronic apparatus comprising the resonator according to claim 2.

15. An electronic apparatus comprising the resonator according to claim 3.

16. An electronic apparatus comprising the resonator according to claim 4.

17. A vehicle comprising the resonator according to claim 1.

18. A vehicle comprising the resonator according to claim 2.

19. A vehicle comprising the resonator according to claim 3.

20. A vehicle comprising the resonator according to claim 4.

* * * * *